United States Patent [19]
Zumeris et al.

[11] Patent Number: 5,640,063
[45] Date of Patent: Jun. 17, 1997

[54] WINDOW RAISING DEVICE

[75] Inventors: Jona Zumeris, Nesher; Izhak Rafaeli, Haifa, both of Israel

[73] Assignee: Nanomotion Ltd., Haifa, Israel

[21] Appl. No.: 504,710

[22] Filed: Jul. 20, 1995

[30] Foreign Application Priority Data

Nov. 10, 1994 [IL] Israel ......................................... 111597

[51] Int. Cl.$^6$ ...................................................... H02N 2/00
[52] U.S. Cl. ............................ 310/328; 310/317; 310/323
[58] Field of Search ......................................... 310/317, 323, 310/328

[56] References Cited

U.S. PATENT DOCUMENTS

| | | | |
|---|---|---|---|
| 4,483,571 | 11/1984 | Mishiro | 310/323 |
| 4,692,649 | 9/1987 | Izukawa et al. | 310/323 |
| 4,742,260 | 5/1988 | Shimizu et al. | 310/323 |
| 4,947,077 | 8/1990 | Murata | 310/328 |
| 5,039,899 | 8/1991 | Yamaguchi | 310/323 |
| 5,087,851 | 2/1992 | Nakazawa et al. | 310/323 |
| 5,140,215 | 8/1992 | Yamaguchi | 310/323 |
| 5,200,665 | 4/1993 | Iijima | 310/323 |
| 5,216,313 | 6/1993 | Ohnishi et al. | 310/323 |
| 5,237,238 | 8/1993 | Berghaus et al. | 310/328 |
| 5,416,375 | 5/1995 | Funakubo et al. | 310/323 |
| 5,453,653 | 9/1995 | Zumeris | 310/323 |

FOREIGN PATENT DOCUMENTS

| | | | |
|---|---|---|---|
| 0155694 | 9/1985 | European Pat. Off. | H01L 41/09 |
| 0297574 | 1/1989 | European Pat. Off. | H01L 41/08 |
| 0633616 | 1/1995 | European Pat. Off. | H01L 41/08 |
| 0249480 | 10/1988 | Japan | 310/323 |
| 0081670 | 3/1989 | Japan | 310/323 |
| 0202382 | 8/1990 | Japan | 310/323 |
| 0173364 | 7/1991 | Japan | 310/317 |
| 0178574 | 8/1991 | Japan | 310/311 |
| 6292374 | 10/1994 | Japan | 310/311 |
| 693493 | 10/1979 | U.S.S.R. | H01L 41/10 |

*Primary Examiner*—Thomas M. Dougherty
*Attorney, Agent, or Firm*—Skjerven, Morrill, MacPherson, Franklin & Friel, LLP

[57] ABSTRACT

An even plurality of piezoelectric motor units operating directly on an element to be vertically translated, such as a car window, is disclosed. Each pair of piezoelectric motor units are located along an horizontal line on opposing sides of the element. The piezoelectric motors are preferably, asynchronously operated. An activation system for providing alternating current (AC) voltage to each of the piezoelectric motor units and converting direct current voltage to a sinusoidal square wave, is also included.

10 Claims, 8 Drawing Sheets

WINDOW RAISING DEVICE

FIELD OF THE INVENTION

The present invention relates to vertical, linear motion and to piezoelectric motors generally and to motion of car windows with piezoelectric motors in particular.

BACKGROUND OF THE INVENTION

Linear motion is known in the art and is achieved in numerous ways. Vertical, linear motion is also known and, in particular, is utilized in automatic opening and closing of car windows.

Figure 1:
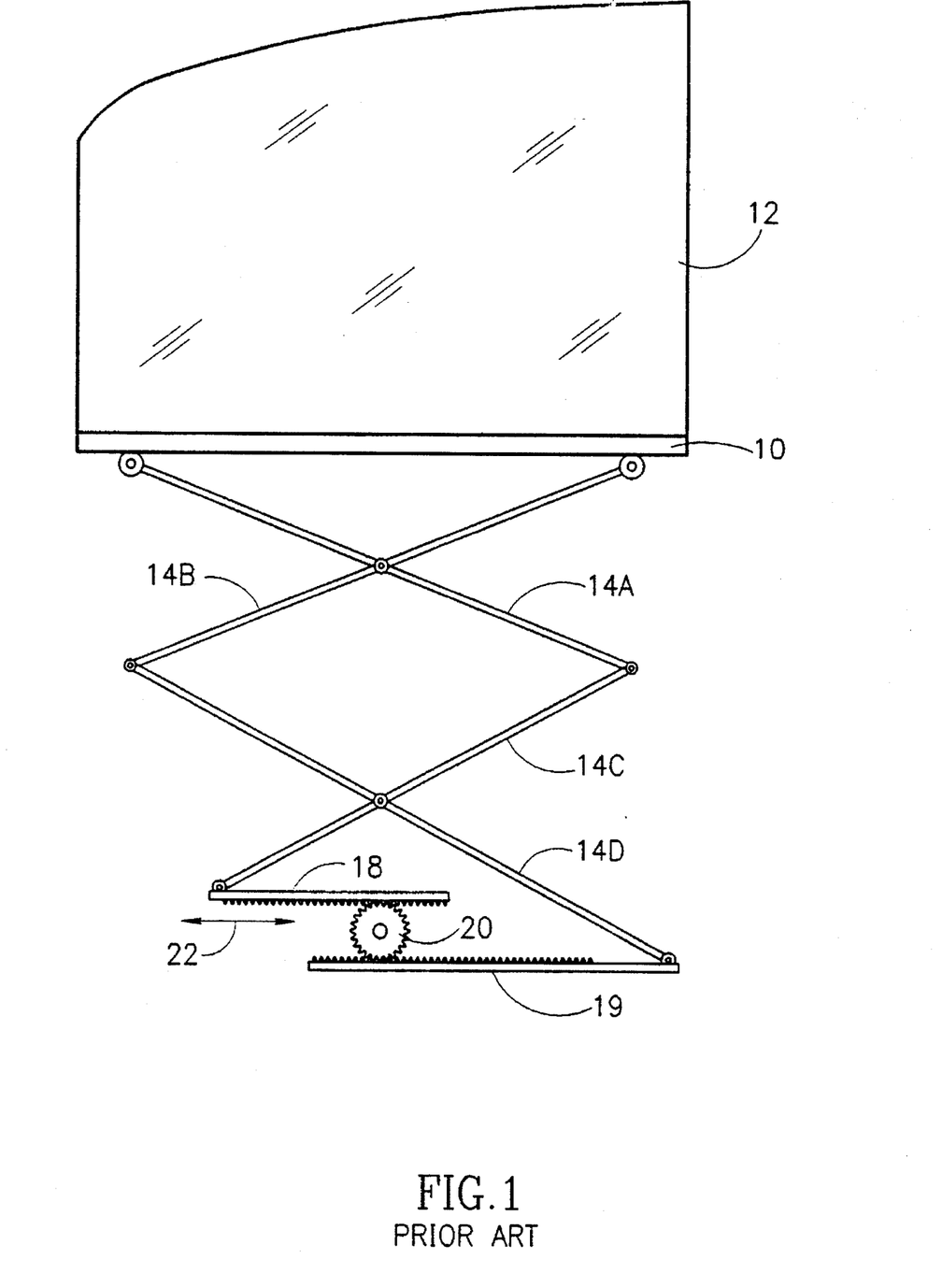
FIG. 1 is a schematic illustration of a prior art car window raising and lowering apparatus.

There are many types of mechanisms to open and close a car window, one of which is shown in FIG. 1 to which reference is made. The structure includes at least a base 10 for the window 12 and four criss-crossed rods 14 attached to each other at pivots 16. Two of the rods 14 (those labeled 14a and 14b) are attached to the base 10 also by pivots 16. Rod 14c is rotatably attached to a movable rack 18 while rod 14d is rotatably attached to a stationary rack 19; both racks are moved by a rotatable pinion 20. Pinion 20 can be operated manually or via a motor (not shown).

When pinion 20 rotates, it causes rack 18 to move to the right or left, as indicated by arrow 22. When rack 18 moves to the left, it pulls rod 14c to the left, which causes rod 14d to pivot counterclockwise. In response to the lowering movement of both rods 14c and 14d, rods 14a and 14b become more horizontal and thus, the window 12 is lowered. The opposite occurs when the rack 18 is moved to the right.

The structure shown in FIG. 1 is extremely bulky, requiring the entire inner space of a door. Furthermore, operation of the structure creates a large dynamic force which cannot quickly be stopped. Thus, an arm can easily be caught and tightly pressed between the window and its outer window frame (not shown in FIG. 1).

Piezoelectric motors are known in the art. SU 693493 describes a piezoelectric motor comprising a flat rectangular piezoelectric plate having one electrode covering essentially all of one large face of the plate ("the back face") and four electrodes each covering a quadrant of the front face. The back electrode is grounded and the electrodes of the front face are electrically connected on the diagonal. Two ceramic pads are attached to one of the long edges of the plate and these pads are pressed against the object to be moved by a spring mechanism which presses the other long edge.

The long and short edges of the piezoelectric ceramic have similar resonant frequencies (for different mode orders) such that, when one pair of connected electrodes is excited with an alternating current (AC) voltage to which the ceramic is responsive, the object moves in one direction, and when the other pair of electrodes is excited, the object moves in the other direction.

SUMMARY OF THE PRESENT INVENTION

It is an object of the present invention to provide apparatus for vertical, linear motion which, in particular, can be applied to the raising and lowering of car windows. It is a further object of the present invention that the apparatus respond relatively quickly to control signals.

There is therefore provided, in accordance with a preferred embodiment of the present invention, an even plurality of piezoelectric motor units operating directly on the element to be vertically translated. Any pair of piezoelectric motor units are located along an horizontal line on opposing sides of the element. Preferably, the piezoelectric motors are asynchronously operated.

Additionally, in accordance with a preferred embodiment of the present invention, each of the piezoelectric motor units can include more than one piezoelectric motor. Each of the piezoelectric motor units preferably includes a piezoelectric ceramic, two stationary supports and two flexible supports. The stationary supports are located below the piezoelectric ceramic. Alternatively, the piezoelectric motor units can include two rotatable and two flexible supports. In this embodiment, the rotatable supports are located below the piezoelectric ceramic and the spacer has a curved surface.

Moreover, in accordance with a first preferred embodiment of the present invention, the element to be vertically translated has a groove and each of the piezoelectric motors has a spacer which has a protrusion which at least partially fits into the groove.

Alternatively, in accordance with a second preferred embodiment of the present invention, the element to be vertically translated has a protrusion and the spacers of the piezoelectric motors pushes at least against the protrusion.

Further, in accordance with a preferred embodiment of the present invention, at least some of the pairs of piezoelectric motor units are perpendicular to a short face of the element to be vertically translated. Alternatively, the pairs of piezoelectric motor units can be perpendicular to a long face of the element to be vertically translated.

Further, in accordance with a preferred embodiment of the present invention, the present invention includes an activation system for providing alternating current (AC) voltage to each of the piezoelectric motor units. The activation system converts a direct current voltage to a sinusoidal square wave.

There is also provided, in accordance with a still further preferred embodiment of the present invention, a translation unit which includes at least one pair of vertically placed piezoelectric motor units for providing vertical motion and at least one pair of horizontally placed piezoelectric motor units for providing horizontal motion. Both pairs of motor units are located along an horizontal line on opposing sides of the element. A controller and two activation units are also included. The controller selects between horizontal and vertical motion. The first activation unit has a low frequency and activates the selected pair of piezoelectric motor units (as indicated by the controller) to push in the selected, horizontal or vertical, direction. The second activation unit has a high frequency and activates the non-selected pair of piezoelectric motor units to knock against the element to be translated at the high frequency.

Finally, there is still further provided, in accordance with yet another preferred embodiment of the present invention, apparatus for vertically translating an element which includes a bar to which the element is attached and two asynchronously operated, piezoelectric motor units located along an horizontal line on opposing edges of the bar.

BRIEF DESCRIPTION OF THE DRAWINGS

The present invention will be understood and appreciated more fully from the following detailed description taken in conjunction with the drawings in which:

FIG. 4 illustrates only half of the apparatus;

FIG. 5 illustrates only half of the apparatus;

FIG. 6 illustrates only half of the apparatus;

DETAILED DESCRIPTION OF PREFERRED EMBODIMENTS

Figure 2:
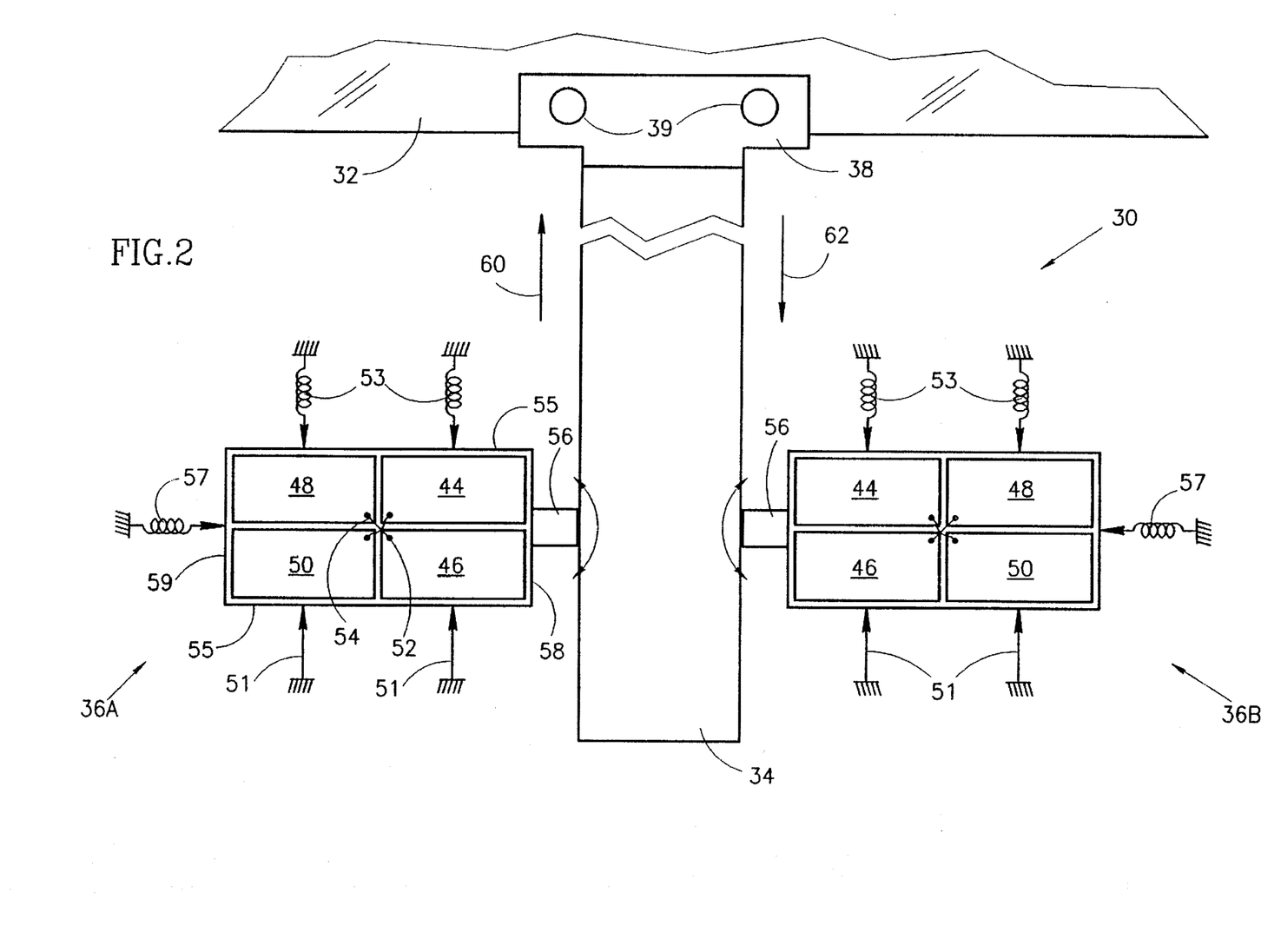
FIG. 2 is a schematic illustration of apparatus for providing vertical linear motion, constructed and operative in accordance with a first embodiment of the present invention.

Reference is now made to FIG. 2 which illustrates apparatus 30 for vertical, linear motion constructed and operative in accordance with a first embodiment of the present invention, implemented for raising and lowering a car window 32.

Apparatus 30 comprises a bar 34 to be moved vertically and two piezoelectric motor units 36a and 36b, located along a horizontal line, on two opposing sides of bar 34. Bar 34 is formed of a relatively hard material having abrasive resistance and is mounted onto the element to be moved, such as the window 32, via any suitable mounting element. Shown in FIG. 2 is a brace 38 attached via bolts 39.

The piezoelectric motor units 36 can include any number of piezoelectric motors (only one is shown for each unit 36) and can be any type of piezoelectric motor unit 36 which can provide the desired amount of dynamic force in the desired amount of time. For example, a typical window weighs 1.5 kilo and has to be raised 40 cm within 3 seconds. The motors should also provide bidirectional (up and down) motion. The piezoelectric motors commercially manufactured by Nanomotion Ltd. of Haifa, Israel, are suitable.

The operation of a piezoelectric motor is briefly described herein; the details of its operation can be found in Israel Patent Application 106,296 to the common assignees of the present invention. Israel Patent Application 106,296 is incorporated herein by reference.

Four electrodes 44, 46, 48 and 50 are plated or otherwise attached onto the face (hereinafter "the first face") of a piezoelectric ceramic 42 to form a checkerboard pattern of rectangles, each substantially covering one-quarter of the first face. The opposite face ("the second face") of the piezoelectric ceramic 42 is substantially covered with a single electrode (not shown). Diagonally located electrodes (44 and 50, 48 and 46) are electrically connected by wires 52 and 54 preferably placed near the junction of the four electrodes. The electrode on the second face is preferably grounded.

A relatively hard spacer 56 is attached to a short edge 58 of piezoelectric ceramic 42, preferably at the center of the edge.

The piezoelectric ceramic 42 vibrates when electrified. The dimensions of the rectangular large face are preferably chosen such that the piezoelectric ceramic 42 has closely spaced resonance frequencies in an X and a Y direction (the directions of the rectangular face of the piezoelectric ceramic 42), albeit in different modes. Typically, the resonances have overlapping response curves; thus, excitation of the piezoelectric ceramic is achieved by connecting an alternating current (AC) voltage at a frequency at which both modes are excited, to selected ones of the electrodes. When excited, standing waves at the resonant frequencies are formed in the ceramic 42 in both the X and Y directions.

The piezoelectric ceramic 42 is constrained by a pair of fixed supports 51 and by two flexible supports 53. Supports 53 are typically formed of rubber. Supports 51 and 53 contact piezoelectric ceramic 42 at points of zero movement in the standing wave of the X direction. The points of zero movement are along a pair of long edges 55 of the ceramic 42. These supports are designed to slide in the Y direction. A flexible support 57 is pressed against the middle of a second short edge, labeled 59, of ceramic 42, opposite short edge 58. Support 57 continually supplies pressure (a "preload") between ceramic 42 and the body to be moved, such as the bar 34 of FIG. 2, which causes the motion of ceramic 42 to be transmitted to the body to be moved.

It is noted that, when a piezoelectric motor is operated, it moves its spacer 56 alternately in the X and Y directions, where the Y direction is defined, as shown, as being along the long axis of the piezoelectric motor. In the present invention, movement in the Y direction pushes the bar 34 slightly away from the spacer 56. When the bar 34 returns to the spacer 56, the bar 34 is relatively tightly pushed against the spacer 56 and thus, the spacer's movement in the X direction pushes the bar 34 in the X direction. In the present invention, movement in the X direction is slightly up (as noted by arrow 60) or slightly down (as noted by arrow 62) with respect to gravity.

The spacer 56 does not move a significant distance in either the X or Y directions. However, its repeated pushing, at a rate of typically 20–200 Khz, causes the bar 34 to move significantly up or down, as desired. If the amount of force required to move the element 70 is large, each piezoelectric motor unit 36 can include many piezoelectric motors.

It is noted that the fixed supports 51 of the piezoelectric motors of the two piezoelectric motor units 36a and 36b are below the piezoelectric ceramic 42, thereby to support the piezoelectric motors against gravity. If the units 36 contain many piezoelectric motors, for each, the fixed supports 51 are located below the ceramic 42.

Furthermore, it is noted that the two units 36a and 36b operate in opposition to each other in the Y direction and together in the X direction. However, since the movements of the spacers 56 are repetitive and small, the two units 36 do not have to be synchronized with each other. Thus, each unit 36 can include many piezoelectric motors, none of which are synchronized together but whose directions of movement in the X direction are the same.

It is believed to be preferred to place the piezoelectric motor units 36 directly opposite each other although situations may exist wherein this condition is not required.

Since the piezoelectric motor units 36 are small, on the order of a few centimeters, they do not occupy much space in the car door in which a car window is to be lowered and raised.

Because of the preloading provided by supports 57, the piezoelectric motor units 36 are in contact with the bar 34 whenever the units 36 are not activated. Thus, the bar 34 will not fall when the power to the units 36 fails. Applicants have realized that, because of the contact, if someone attempts to push the element 70 down (in the window example, to open the window when there is no power), the bar 34 will move down causing the spacers 56 to rotate slightly. Since the spacers 56 have flat surfaces, the spacers 56 will rotate into the bar 34 which will increase the friction between the bar 34 and the spacers 56.

It will be appreciated that more than one apparatus 30 can be utilized, if desired. Thus, window 32 can be raised and lowered by a plurality of apparatus 30, each comprising a bar 34 and two piezoelectric motor units 36 which raise and lower the bar 34.

Figure 3A:
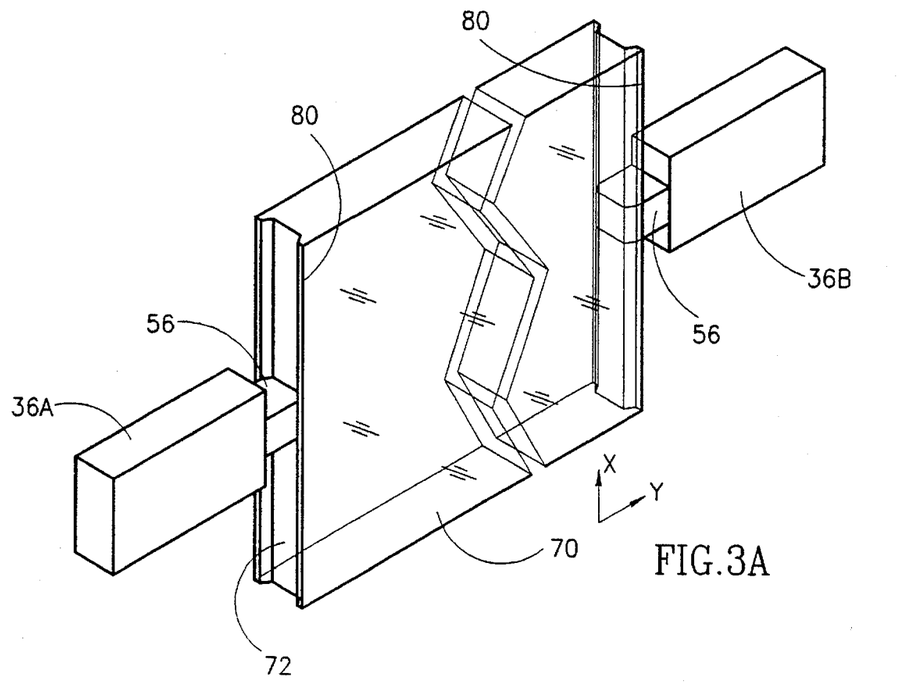
FIG. 3A is a schematic illustration of a second embodiment of the apparatus of the present invention wherein the apparatus directly contacts the element to be moved.
Figures 3B, 4:
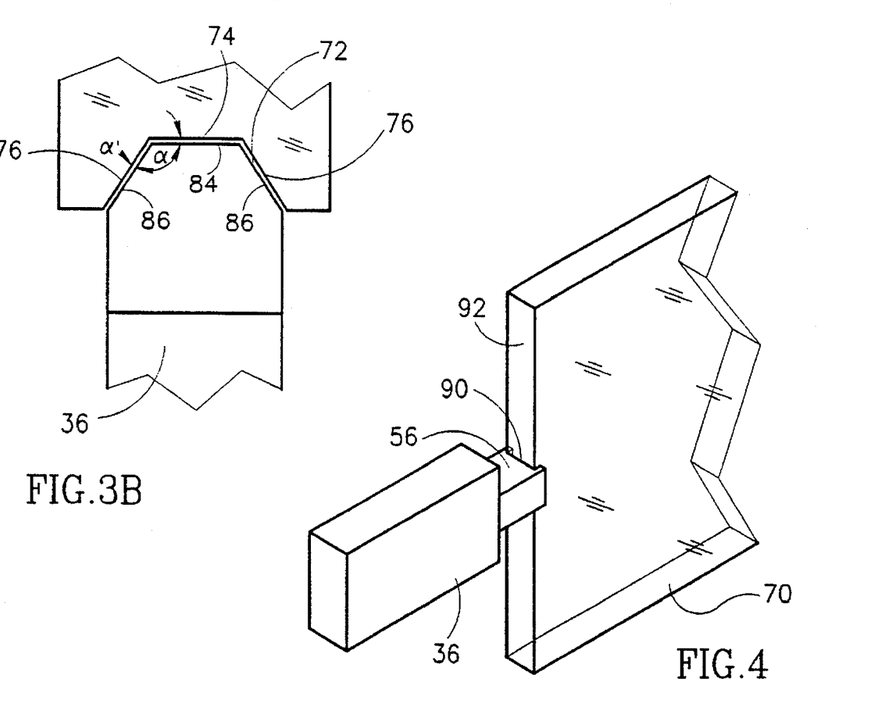
FIG. 3B is a cross-sectional illustration of the contact area between the apparatus of the present invention and the element to be moved.
FIG. 4 is a schematic illustration of a third embodiment of the apparatus of the present invention wherein the apparatus directly contacts the element to be moved without affecting the shape of the element to be moved.

Reference is now made to FIGS. 3A, 3B and 4 which illustrate alternative embodiments of the apparatus for providing vertical, linear motion in which the element to be moved is directly operated upon by the piezoelectric motor units of the present invention. In FIGS. 3A, 3B and 4, the element to be moved is, once again, a car window, labeled 70. For the purposes of clarity, the details of the piezoelectric motor units are not shown since they are not different than that shown in FIG. 2.

In this embodiment, the opposing piezoelectric motor units 36a and 36b (shown, for exemplary purposes only, as a single piezoelectric motor) operate directly on the element 70. If the element 70 to be moved is of a slippery material (i.e. one whose coefficient of friction with respect to the material of the spacer 56 is low), the element 70 has grooves 72 formed therein which the spacers 56 are formed to match. If desired the grooves can be covered with a hard, abrasive material, to increase the friction between the spacer and the element 70.

The groove 72 and spacers 56 are shown in detail in FIG. 3B. The groove 72 has three surfaces, a base surface 74 and two side surfaces 76. The end of the spacer 56 also has three surfaces, a main surface 84 and two side surfaces 86. The side surfaces 76 and 86 are at an angle α to the base surface 74 and the main surface 84, respectively.

When the spacer 56 is pushed into the groove 72, the main surface 84 contacts the base surface 74 and/or the side surfaces 86 contact the side surfaces 76. Thus, side surfaces 76 and 86 increase the contacting surface area of the spacer 56. Other shaped grooves, such as those having a triangular cross-section, are also within the scope of the present invention.

As in the previous embodiment, the piezoelectric motor units 36 oppose each other in the Y direction and work together in the X direction. In addition, the piezoelectric motor units 36 are located opposite each other along the sides 80 of the element 70.

As shown in FIG. 4, the spacer 56 can alternatively have the groove, labeled 90. For the purposes of clarity, only one operating side of the element 70 to be moved is shown.

In this embodiment, the side, labeled 92, of the element 70 fits into the groove 90 of the spacer 56. In FIG. 4, the groove 90 is shown as being square; however, it can have any shape, such as the trapezoidal shape of FIGS. 3A and 3B. In that case, the side 92 is shaped to match.

It will also be appreciated that the spacer 56 can be formed of a material having a high coefficient of friction with the material of the element 70 to be moved.

Figure 5:
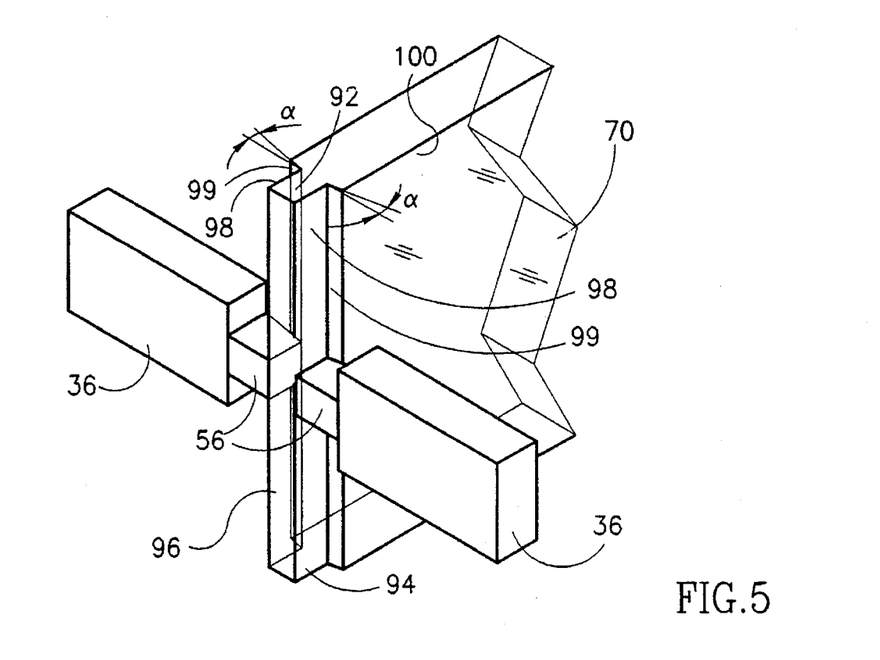
FIG. 5 is a schematic illustration of a fourth embodiment of the present invention in which the apparatus of the present invention contacts the long face of the element to be moved.

In the previous embodiments, the piezoelectric motor units 36 were placed along the thin sides 92 of the element 70 to be moved. In the embodiment of FIG. 5, to which reference is now made, the opposing piezoelectric motor units 36 are placed perpendicular to the long face, labeled 100 in FIG. 5, of the element 70 to be moved. For this embodiment, four ceramic units 36 are necessary, two on each side 92 of the element to be moved. However, as in FIG. 4, only one operating side of the element 70 to be moved is shown.

As in previous embodiments, the sides 92 are shaped to provide the spacers 56 with more surface area to contact. In the embodiment of FIG. 5, each side 92 is formed into a long, rod-like protrusion 94 having a front surface 96 and two side surfaces 98. In addition, each side 92 has surfaces 99 from which the protrusion 94 protrudes.

Each of the four spacers 56 contact one surface 98 and its neighboring surface 99, where the surfaces 98 form the main contacting surfaces and the neighboring surfaces 99 provide additional contacting surface area. The neighboring surfaces 99 can be angled, if desired, in which case, the spacers 56 are also shaped to match.

Figure 6:
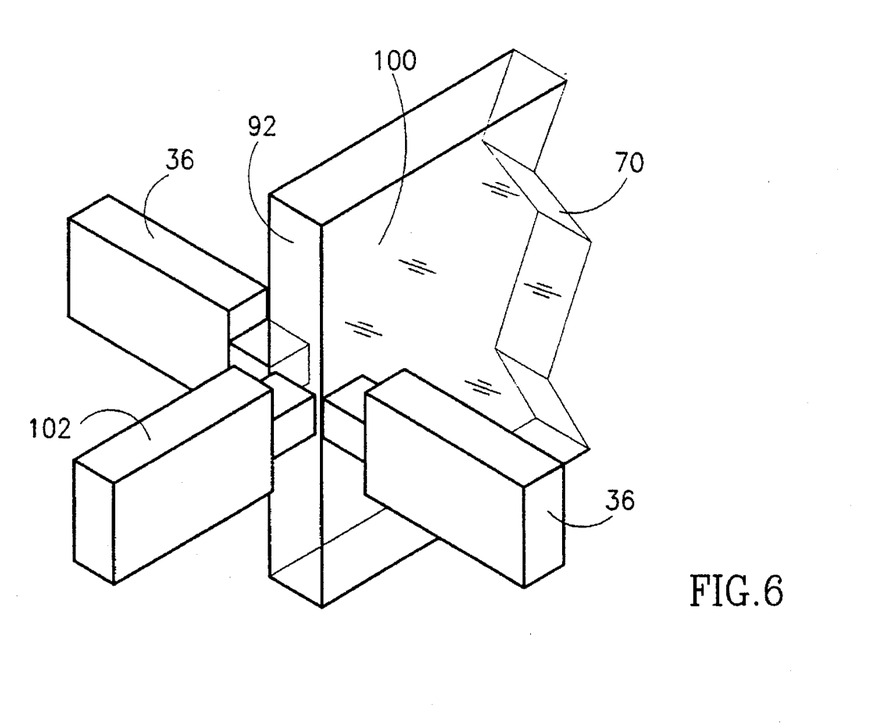
FIG. 6 is a schematic illustration of a fifth embodiment of the present invention in which the apparatus of the present invention contacts the long face of the element to be moved without affecting the shape of the element to be moved.

Alternatively, as shown in FIG. 6 to which reference is now briefly made, the piezoelectric motor units 36 can directly contact the long face 100. In FIG. 6, as in the FIGS. 4 and 5, only one operating side of the element 70 to be moved is shown.

If a larger raising force is desired, a further motor unit, labeled 102, can be placed along each side 92 of the element 70 to be moved.

Figure 7:
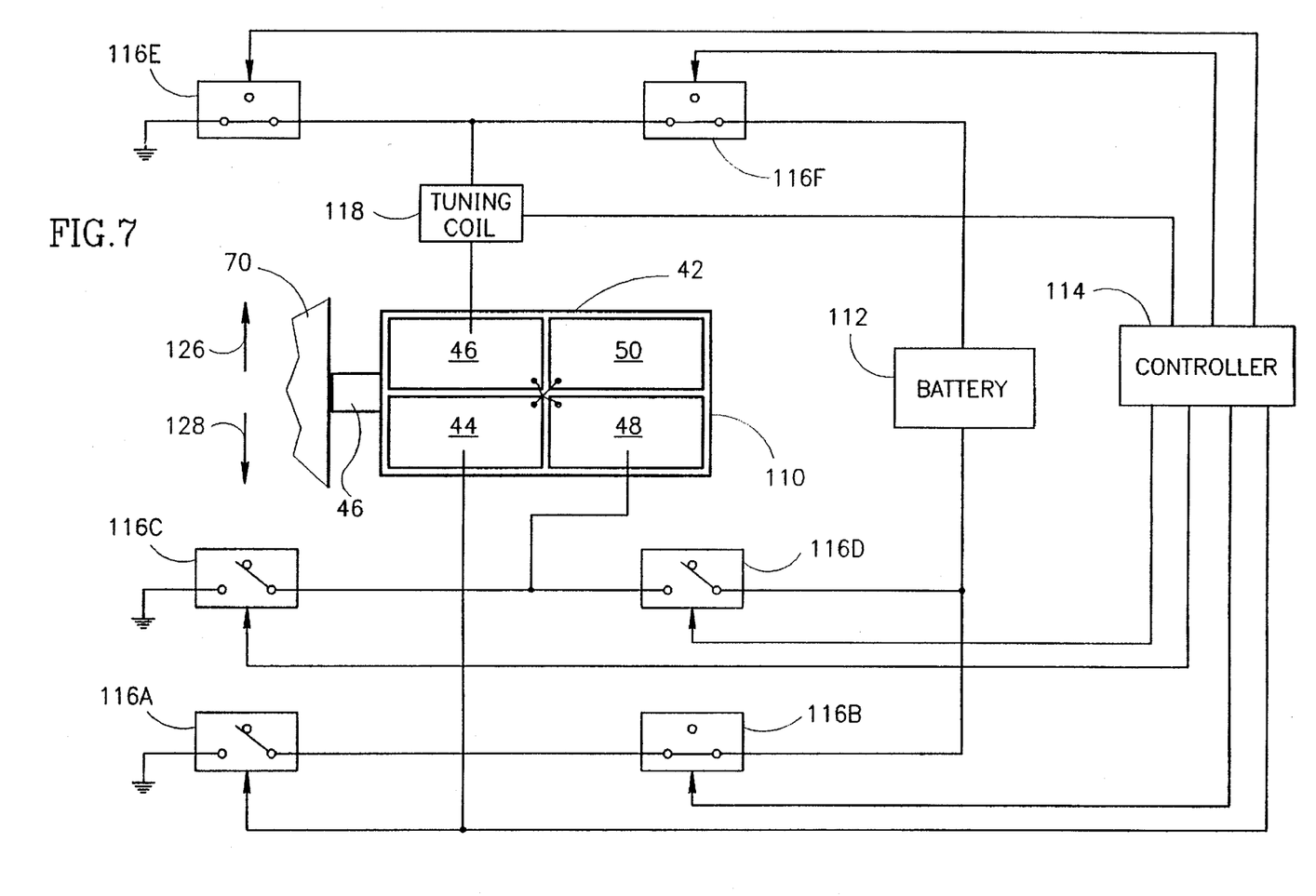
FIG. 7 is a partially schematic, partially circuit diagram illustration of an activation system for one piezoelectric motor, useful in the apparatus of FIGS. 2–6.
Figure 8A:
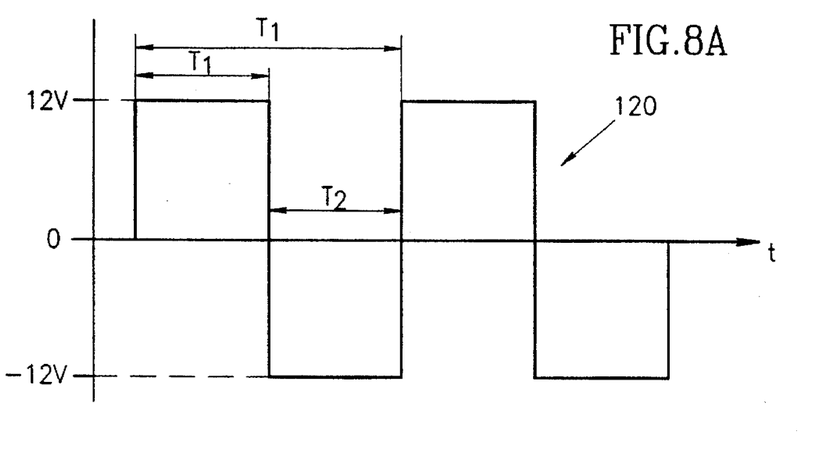
FIG. 8A and 8B are a graphical illustrations of a forcing function and its resultant activation function, respectively, for the activation system of FIG. 7.
Figure 8B:
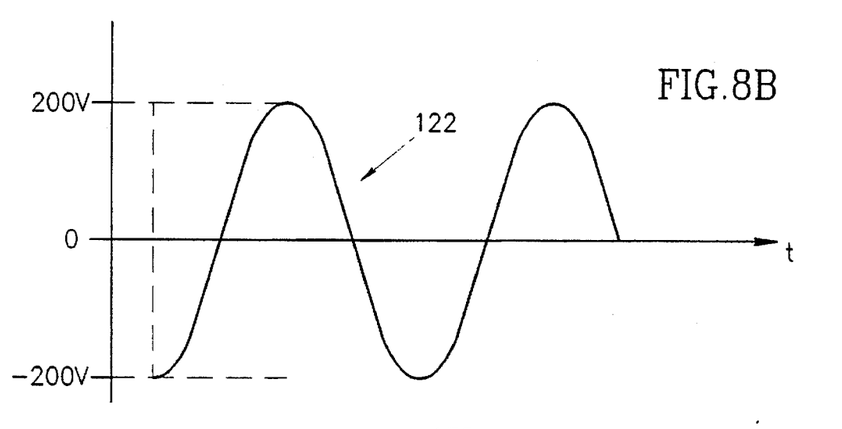

Reference is now made to FIGS. 7, 8A and 8B which illustrate how each piezoelectric motor of a piezoelectric motor unit 36 is excited. FIG. 7 is a partially schematic, partially circuit diagram of the activation system of a piezoelectric motor, labeled 110. FIGS. 8A and 8B are illustrations of the forcing function and its resultant activation function for the system of FIG. 7.

It will be appreciated that piezoelectric motors are typically activated with AC voltage signals. Thus, any situation where only a direct current (DC) voltage signal is available requires a conversion system from DC to AC at the desired frequencies. The system of FIG. 7 is exemplary only; other activation systems which are known or which may be designed can also be utilized.

The activation system of FIG. 7 provides an approximately 400 V peak-to-peak AC signal from a 12 V battery 112, such as is found in a car. For each piezoelectric motor, the system comprises a controller 114, six switches 116a, 116b, 116c, 116d 116e and 116f and a tunable coil 118. Coil 118 is connected in series with the piezoelectric ceramic 42 to form a resonance circuit and controller 114 controls the on/off states of the switches 116 and the state of the coil 118.

It is noted that switches 116a, 116c and 116e are connected to ground on output while switches 116b, 116d and 116f are connected to the battery 112 on input and to the switches 116a, 116c and 116e, respectively, on output. The output of switches 116b and 116d are also connected to electrodes 44 and 48, respectively. Electrodes 44 and 48 are respectively connected to electrodes 50 and 46 via wires 52 and 54, respectively.

The output of coil 118 is connected to the piezoelectric ceramic 42 and the coil is tuned so the resonance frequency of the circuit will match the resonance frequency of the piezoelectric ceramic 42.

The piezoelectric motor 110 is operated as follows: initially, switches 116c and 116d are open and switches 116b and 116f are closed. Thus, no current is provided to electrode 48 nor, via wire 54, to electrode 46.

Switches 116a and 116e continually have opposite states which are rapidly changed. Thus, when switch 116a is closed, switch 116e is open and vice-versa. Since switches 116a and 116e connect to ground when they are closed and are on opposite sides of battery 112 and, since switch 116b continually connects electrodes 44 and 50 to the battery 112, the alternating activity of switches 116a and 116e continually changes the direction of the voltage provided to the electrodes 44 and 50.

The resultant forcing function on the piezoelectric motor 110 is the square wave 120 shown in FIG. 8A. Due to the impedance of the circuit, the resultant signal received by the piezoelectric ceramic 42 is the sinusoidal wave 122 of FIG. 8B.

The period T0 is divided into two halves, T1 and T2, where T1 defines the length of time that a positive signal is provided (i.e. switch 116e is closed) and T2 defines the length of time that a negative signal is provided (i.e. switch 116a is closed). If T1 and T2 are equal, an amplitude of about 400 V peak-to-peak can be obtained. Other duty cycles provide a lower peak-to-peak amplitude. The overall period T0 is selected in accordance with the resonance frequency of the piezoelectric motor, as discussed in previously incorporated Israel Patent Application 106,296.

When the forcing function 120 is supplied to quadrants 44 and 50, the element 70 will move down, as indicated by arrow 126. When the forcin function 120 is supplied to quadrants 46 and 48, the element 70 will move up, as indicated by arrow 128. In the second case, forcing function 120 is obtained by closing switches 116f and 116d, opening switches 116a and 116b and alternately closing switches 116c and 116e.

Figure 9:
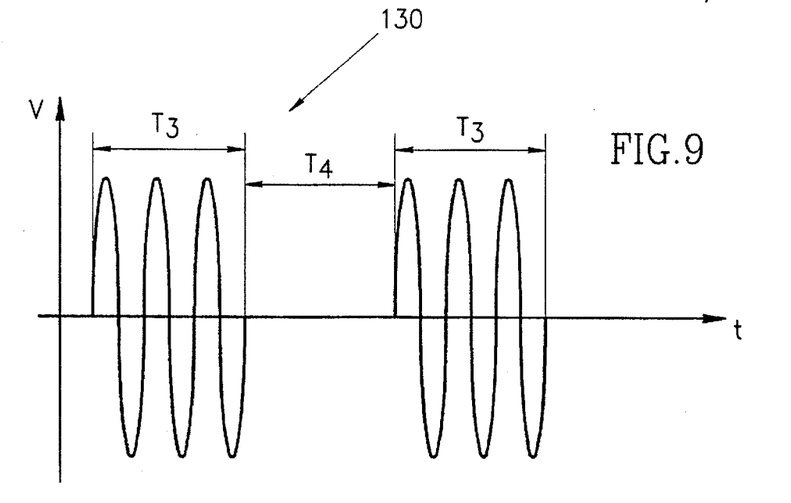
FIG. 9 is a graphical illustration of an alternative forcing for the activation system of FIG. 7.

The piezoelectric motor 110 can alternatively be activated with a pulsed, sinusoidal forcing function 130 such as that shown in FIG. 9. The forcing function 130 has pulses, of length T3, of sinusoidal activity and periods, of length T4, of no activity. Forcing function 130 creates a discontinuous motion having a relatively high dynamic force. The smaller T3 is, the higher the dynamic force is.

It is noted that the piezoelectric motor units on opposing sides of either bar 34 or of the element 70 are independently activated and asynchronously operated.

Figures 10A, 10B:
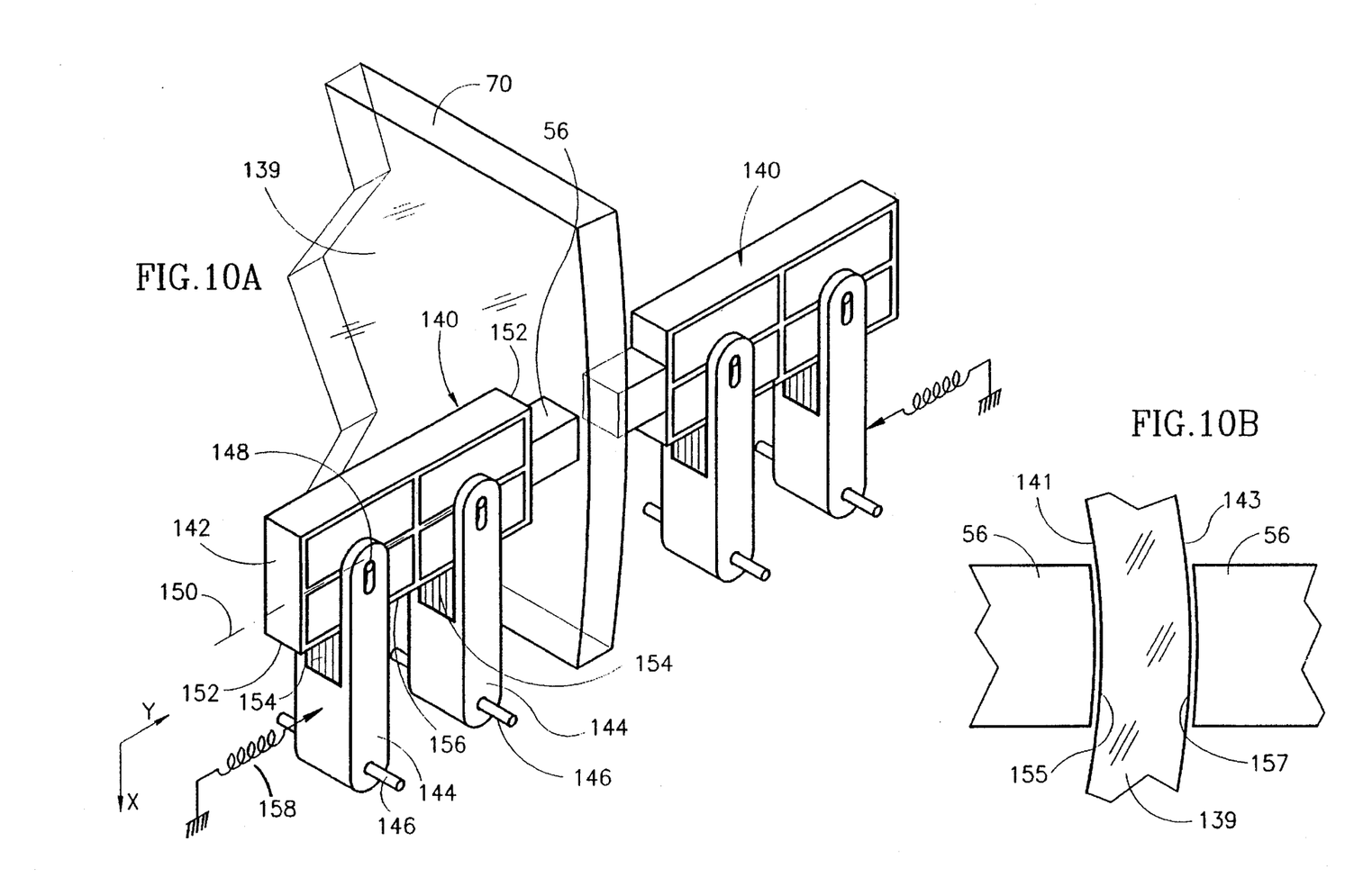
FIG. 10A is a schematic illustration of a piezoelectric ceramic unit for raising and lowering curved windows.
FIG. 10B is an expanded illustration of a portion of the unit of FIG. 10A.

Reference is now made to FIGS. 10A and 10B which illustrate an alternative embodiment of the present invention useful for vertically moving curved elements 139, such as windows. As in the previous embodiments, a pair of piezoelectric motors 140 are utilized. In this embodiment, the two motors operate against the long face of the element and are designed to have a larger range of movement in the Y direction than that of the previously shown piezoelectric motors 140.

The structure of the motors 140 is described in Israel Patent Application 109,399, which is incorporated herein by reference, and therefore, will only be briefly described herein.

The piezoelectric ceramic 142 is supported by two, preferably resilient, holders 144. One end of each holder 144 is preferably rotatably mounted on a respective pin 146 which is fixedly attached to a housing (not shown), while the other end of each holder 144 is rotatably mounted on a respective pin 148 which extends through a respective hole (not shown), in ceramic 142. The pins 148, which typically have an acoustical velocity close to that of the ceramic 142, are mounted at points where the amplitude along the Y axis is substantially zero, as mentioned hereinabove. For example, the points may be along a longitudinal center line 150 of the ceramic 142, 1/6th the length of line 150 from each of the short edges, labeled 152. A resilient support 154 is preferably mounted between the lower end of each holder 144 and one long edge, labeled 156, of the ceramic 142. A preloading rubber spring 158 is provided against one of the holders 144. Its spring constant is typically larger than that of the resilient supports 154.

The provision of holders 144 provides rotation about the pins 146 whenever the spacer 56 pushes against the element 139 in the Y direction. The rotation enables the ceramic 142 to move enough away from the element 139 to avoid hitting the curved surface as it moves upward or downward. It is noted that the motors 140 are rotated in opposite directions since one operates on a concave surface and the other operates on a convex surface.

It is further noted that, as shown in FIG. 10B, the contact surface of the spacers 56 can be formed to match the curve (concave or convex) it is to move. Thus, the spacer 56 which is to contact the inner, concave surface 141 of element 139 has a convex surface 155. Similarly, the spacer 56 which is to contact the outer, convex surface 142 of element 139 has a concave surface 157.

Figure 11:
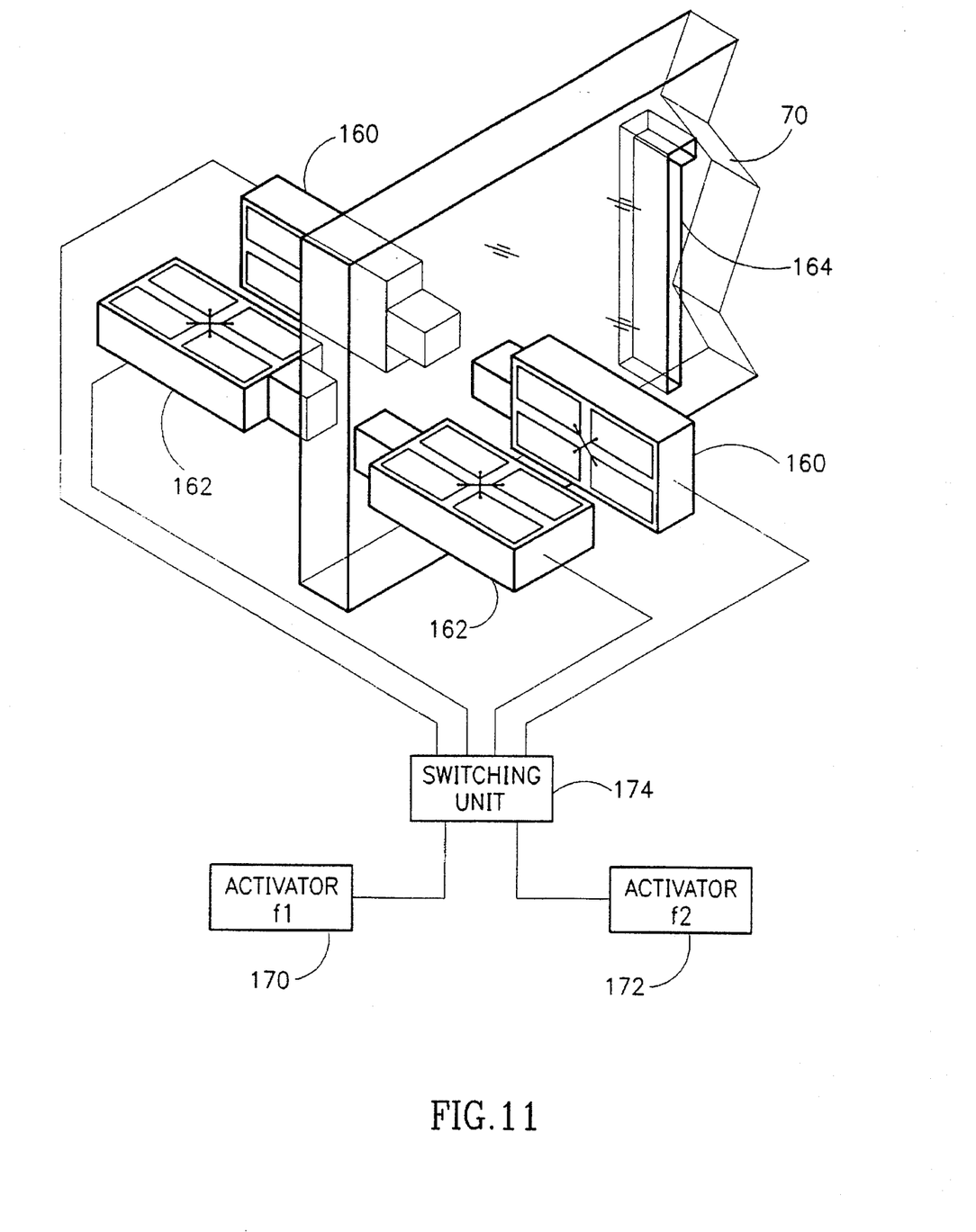
FIG. 11 is a partially schematic, partially block diagram illustration of apparatus for providing two-dimensional movement to an element to be moved.

Reference is now made to FIG. 11 which illustrates a further embodiment of the present invention utilizing two pairs of piezoelectric motors. One pair, labeled 160, of motors provides vertical motion, as in the previous embodiments, and one pair, labeled 162, provides horizontal motion. In the embodiment of a car window, the second pair 162 of motors provides locking by moving the window 166 onto a hook 164.

Since, due to the preloading spring 57 (FIG. 2), the piezoelectric motors 160 and 162 push against the window 166 when not activated, both pairs of motors 160 and 162 have to be activated, even if movement in only one direction is desired. If only vertical motion is desired, the pair 162 has to be activated only to press against the window 166 and not to provide any horizontal motion. The opposite is true if only horizontal motion is desired.

Therefore, the pairs of motors have two separate modes of operation. When a pair is providing a desired motion ("active pair"), each motor of the pair is activated by separately activating diagonal pairs of electrodes with a periodic signal. When a pair not providing the desired motion ("inactive pair"), all of the electrodes of each motor of the pair are simultaneously activated with a periodic signal. When all electrodes of a motor are simultaneously activated, the motor moves its spacer 57 only in the longitudinal (Y) direction.

In order to control the motors 160 and 162, the control system shown in FIG. 11 is utilized. The control system comprises two activation units 170 and 172 and operator controlled, switching means 174 to switch between the two units 170 and 172. Activation units 170 can comprise the circuit shown in FIG. 7, in which case the forcing function is a periodic square wave, or they can comprise an oscillator providing a sinusoidal forcing function.

Since the "inactive" pair of motors produces friction when it presses against the window 166, the length of time the "inactive" pair touches the window 166, at any time, should be minimized. Therefore, the "inactive" pair should be activated at a higher frequency F1 than the frequency F2 of the "active" pair. If activation unit 170 provides the higher frequency F1, the switching means 174 connects the pair to be defined as the "inactive" pair to the higher frequency activation unit 170 and also ensures that all of the electrodes of the "inactive" pair are all forced with the signal from unit 170. At the same time, the switching means 174 connects the pair to be defined as the "active" pair to the other activation unit 172 and ensures that only one diagonal pair of the electrodes of the motors of the "active" pair are forced with the lower frequency signal from unit 172.

It will be appreciated by persons skilled in the art that the present invention is not limited to what has been particularly shown and described hereinabove. Rather the scope of the present invention is defined by the claims which follow:

It will be appreciated by persons skilled in the art that the present invention is not limited to what has been particularly shown and described hereinabove. Rather the scope of the present invention is defined only by the claims which follow:

We claim:

1. A window raising device for vertically raising or lowering a window, the window defining a vertical plane with at least one longitudinal axis thereacross and having two, thin side surfaces and two wide front surfaces, the device comprising: an even plurality of piezoelectric motor units operating directly on said window, wherein each piezoelectric motor unit comprises at least one piezoelectric motor comprised of a piezoelectric ceramic and a spacer and wherein at least two of said piezoelectric motor units operate against said window at opposing ends of said longitudinal axis; and a control unit for controlling the operation of said piezoelectric units.

2. Units according to claim 1 wherein said piezoelectric motors are asynchronously operated.

3. Units according to claim 1 and wherein each of said piezoelectric motor units comprises more than one piezoelectric motor.

4. Units according to claim 1 wherein said thin, side surfaces define a vertical direction, wherein said window has a single groove extending along each of said thin, side surfaces, wherein each of said spacers has a protrusion which at least partially fits into its corresponding said groove, and wherein said piezoelectric motors push said spacers along a direction parallel to said direction defined by said thin, side surfaces.

5. Units according to claim 3 wherein said thin, side surfaces define a vertical direction, wherein said window has a single protrusion extending along each of said thin, side surfaces, wherein each of said spacers pushes at least against its corresponding said protrusion and wherein said piezoelectric motors push said spacers along a direction parallel to said direction defined by said thin, side surfaces.

6. Units according to claim 1 and wherein at least some of said pairs of piezoelectric motor units operate against opposite ones of said wide, front surfaces of said window.

7. Units according to claim 1 and wherein at least some of said pairs of piezoelectric motor units operate against opposite ones of said thin, side surfaces of said window.

8. Translation apparatus for vertically translating a vertically held element having two main surfaces and two side surfaces, the apparatus comprising:

a. at least one pair of vertical motion piezoelectric motor units which operate directly on opposite ones of said two main surfaces for providing vertical motion to said vertically held element;

b. at least one pair of horizontal motion piezoelectric motor units which operate directly on opposite ones of said two main surfaces for providing horizontal motion to said vertically held element;

c. a controller for selecting between horizontal and vertical motion;

d. a first activation unit connected between said vertical and horizontal motion piezoelectric motor units and said controller for receiving control signals from said controller and for activating the selected pair of piezoelectric motor units to push in the selected, horizontal or vertical, direction; and e. a second activation unit connected between said vertical and horizontal motion piezoelectric motor units and said controller for receiving control signals from said controller and for activating the non-selected pair of piezoelectric motor units to knock against said vertically-held element in order to reduce static friction between said motors and said vertically held element.

9. Units according to claim 1 and wherein said control unit includes an activation system connected to said piezoelectric motor units for providing alternating current (AC) voltage thereto.

10. Units according to claim 9 and wherein said activation system includes means for converting a direct current voltage to a sinusoidal square wave thereby to provide said AC current.

* * * * *